United States Patent [19]

Steere, III

[11] Patent Number: 4,970,772

[45] Date of Patent: Nov. 20, 1990

[54] WAFER ALIGNMENT FIXTURE

[75] Inventor: Robert E. Steere, III, Boonton, N.J.

[73] Assignee: Sulzer Brothers Limited, Winterthur, Switzerland

[21] Appl. No.: 446,470

[22] Filed: Dec. 5, 1989

[51] Int. Cl.$^5$ ............................................. B23B 5/22
[52] U.S. Cl. .................................... 29/271; 269/287; 269/903
[58] Field of Search .................. 269/287, 254 R, 903, 269/20, 289 M R, 289 R, 295; 279/46 R, 4, 50, 23 R, 35–37, 79, 106–107; 29/271

[56] References Cited

U.S. PATENT DOCUMENTS 4,306,731 12/1981 Shaw .................................. 269/903

OTHER PUBLICATIONS

IBM Technical Disclosure Bulletin, V. J. Delgado, "Semiconductor Wafer Alignment Fixture", vol. 10, No. 6, Nov. 1967, pp. 828–829.

Primary Examiner—Robert C. Watson
Attorney, Agent, or Firm—Kenyon & Kenyon

[57] ABSTRACT

The wafer alignment fixture is provided with a pair of upstanding walls for mounting of a wafer cassette thereon as well as with a roller parallel to the walls to engage with the wafers of the cassette. Rotation of the roller causes the wafers in the cassette to rotate so as to move the notches of the wafers into alignment with the rollers. Upon coming into alignment with the roller, the wafers drop down onto a pair of support surfaces while being spaced from the roller so that further rotation is precluded. The roller may be tensioned in order to eliminate sag due to the weight of the wafers. Also, a second roller may be provided for rotating the aligned notches of the wafers into a different angular position within the cassette.

26 Claims, 5 Drawing Sheets

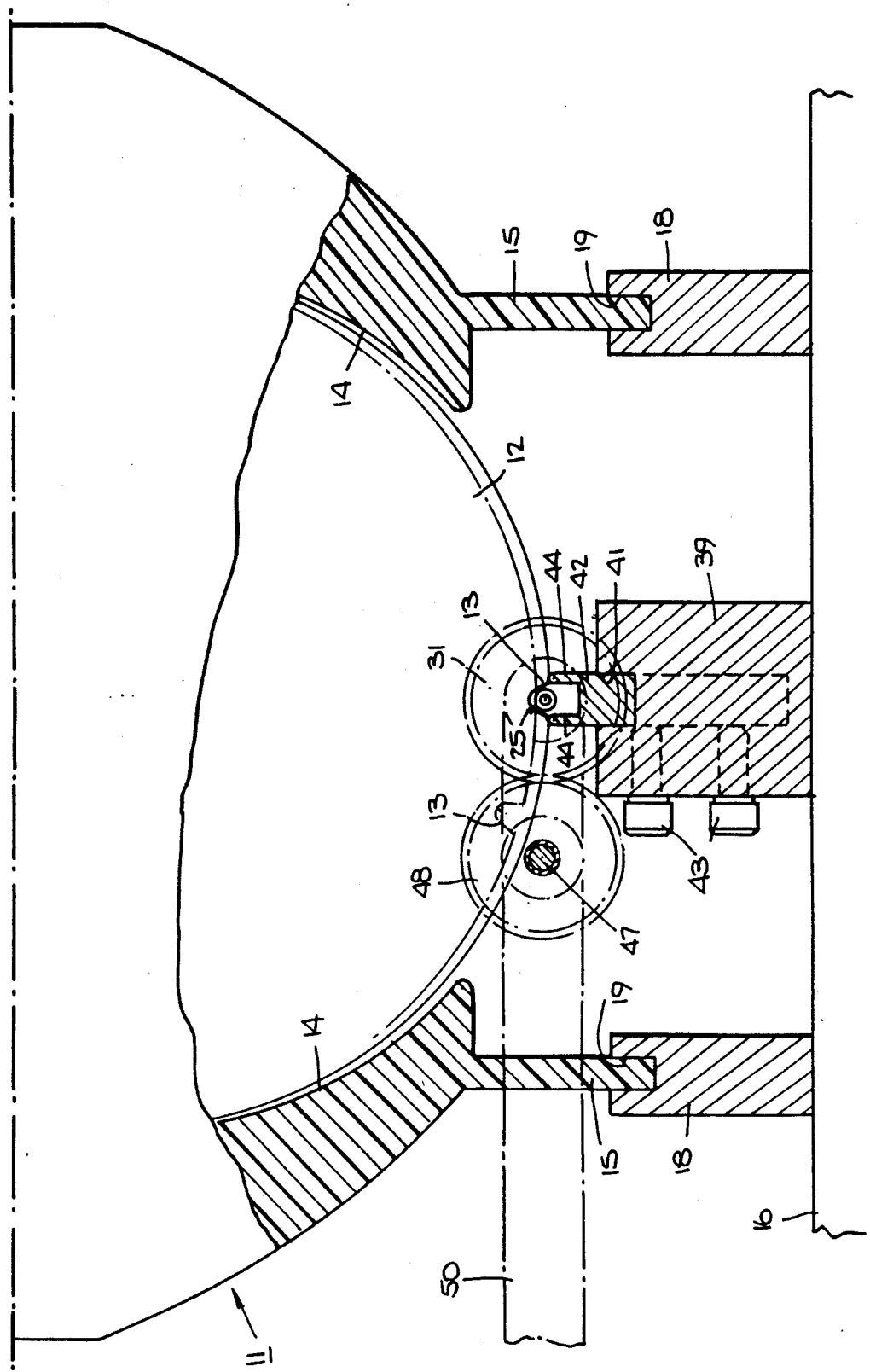

WAFER ALIGNMENT FIXTURE

This invention relates to a wafer alignment fixture. More particularly, this invention relates to an alignment fixture for wafers having a notch in a periphery.

As is known, various types of cassettes have been provided for conveying a plurality of wafers such as silicon wafers from place to place. In some cases, the wafers have been formed with a flat on the periphery by means of which the wafers may be placed in the cassette for transport. However, in some cases, the wafers are not provided with flats but with a small notch in the periphery for identification purposes and subsequent operations. In such cases, it has been difficult to align the wafers in cassettes for subsequent operations.

Accordingly, it is an object of the invention to simplify the alignment of notched wafers in a wafer cassette.

It is another object of the invention to be able to store and transport notched wafers in a cassette in an aligned manner.

Briefly, the invention provides a wafer alignment fixture for aligning wafers in a cassette wherein each wafer has a notch in a periphery.

The fixture includes a cassette support means for receiving a cassette containing a row of wafers at least some of which have a peripheral notch therein. In addition, the fixture has a roller extending in parallel to the cassette support means and below the cassette to contact the row of wafers and to lift the wafers within the cassette when the cassette is placed on the support means. A means is also provided for rotating the roller in order to cause the wafers in contact with the roller to rotate within the cassette in order to bring a notch of a respective wafer into alignment with the roller. When this occurs, the wafer will "drop" down over the roller so that the notch receives the roller and continued rotation of the wafer will cease.

A wafer support means is also provided in the fixture for supporting each wafer when a notch has been aligned with the roller and the roller is positioned within the notch. The wafer support means is constructed so as to be vertically adjusted independently of the roller. This permits the alignment fixture to accommodate different sizes of wafers and differently sized notches. For example, the wafer support means may include an elongated block having a pair of upstanding support surfaces for receiving the wafers thereon and means for adjusting the height of the block. In this case, the roller is disposed so as to extend in parallel between the support surfaces.

The roller may be rotated by any suitable means, for example, a manually operated wheel. In addition, the roller is preferably constructed to have an elastomeric peripheral surface, for example, formed by a plastic tube. A means for tensioning the roller is also provided in order to eliminate sag due to the weight of the wafers.

The alignment fixture may also be provided with a second roller parallel to the first roller and gear means interconnecting the rollers so as to rotate with each other. The second roller is also mounted on a handle which may be lifted from time to time in order to bring the second roller from a rest position spaced from the wafers into a position in contact with an aligned row of wafers. This permits an aligned row of wafers to be rotated in unison with the notches moved into a predetermined position other than in alignment with the first roller.

These and other objects and advantages of the invention will become more apparent from the following detailed description taken in conjunction with the accompanying drawings wherein:

FIG. 5 illustrates a transverse cross-sectional view of the wafer alignment fixture of FIG. 3;

FIG. 6 illustrates a detail view of a wafer during an aligning procedure in accordance with the invention; and FIG. 7 illustrates a detail view of an aligned wafer.

Figure 1:
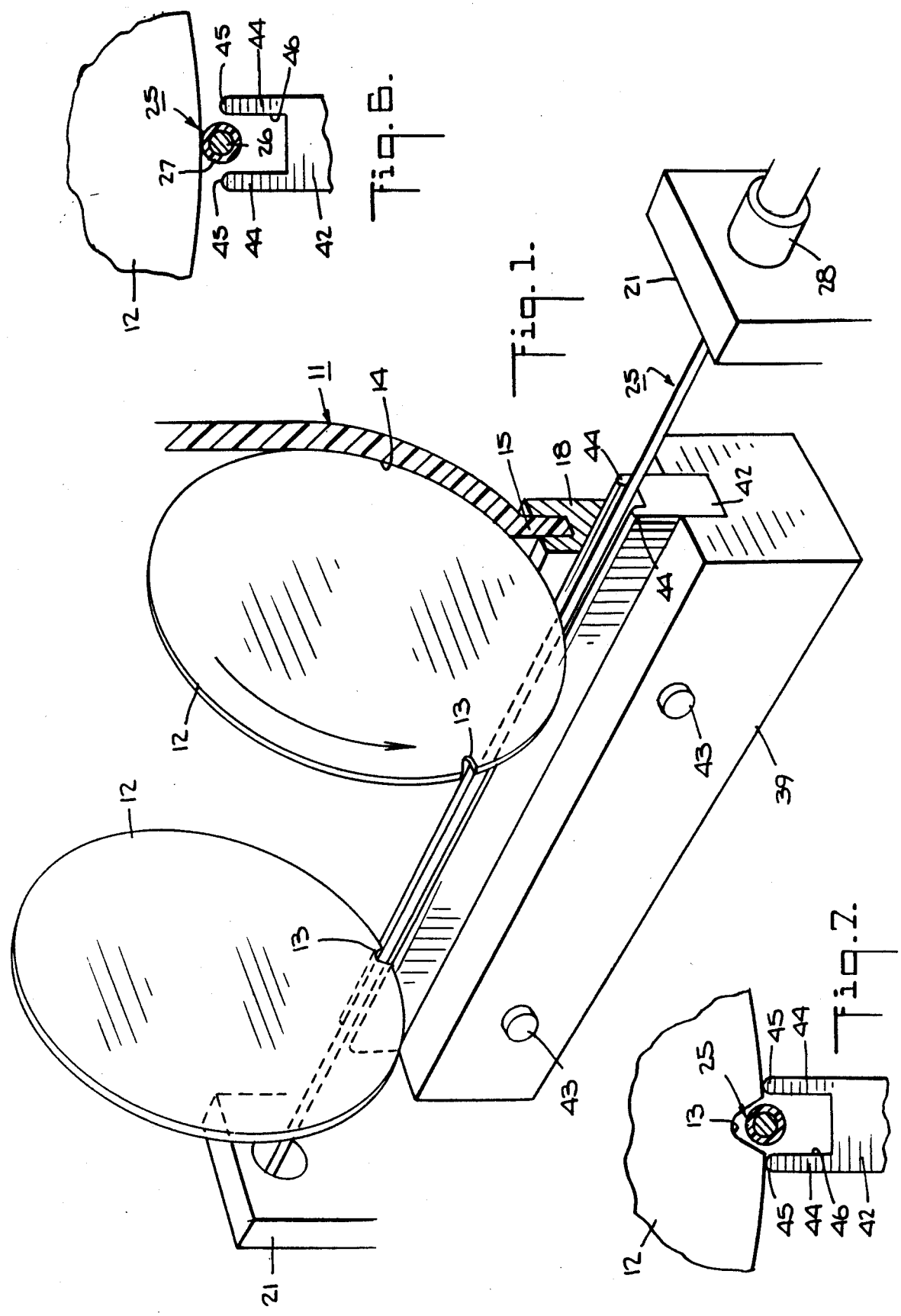
FIG. 1 illustrates a perspective view of a part of the wafer alignment fixture constructed in accordance with the invention with a wafer cassette in place.
Figure 2:
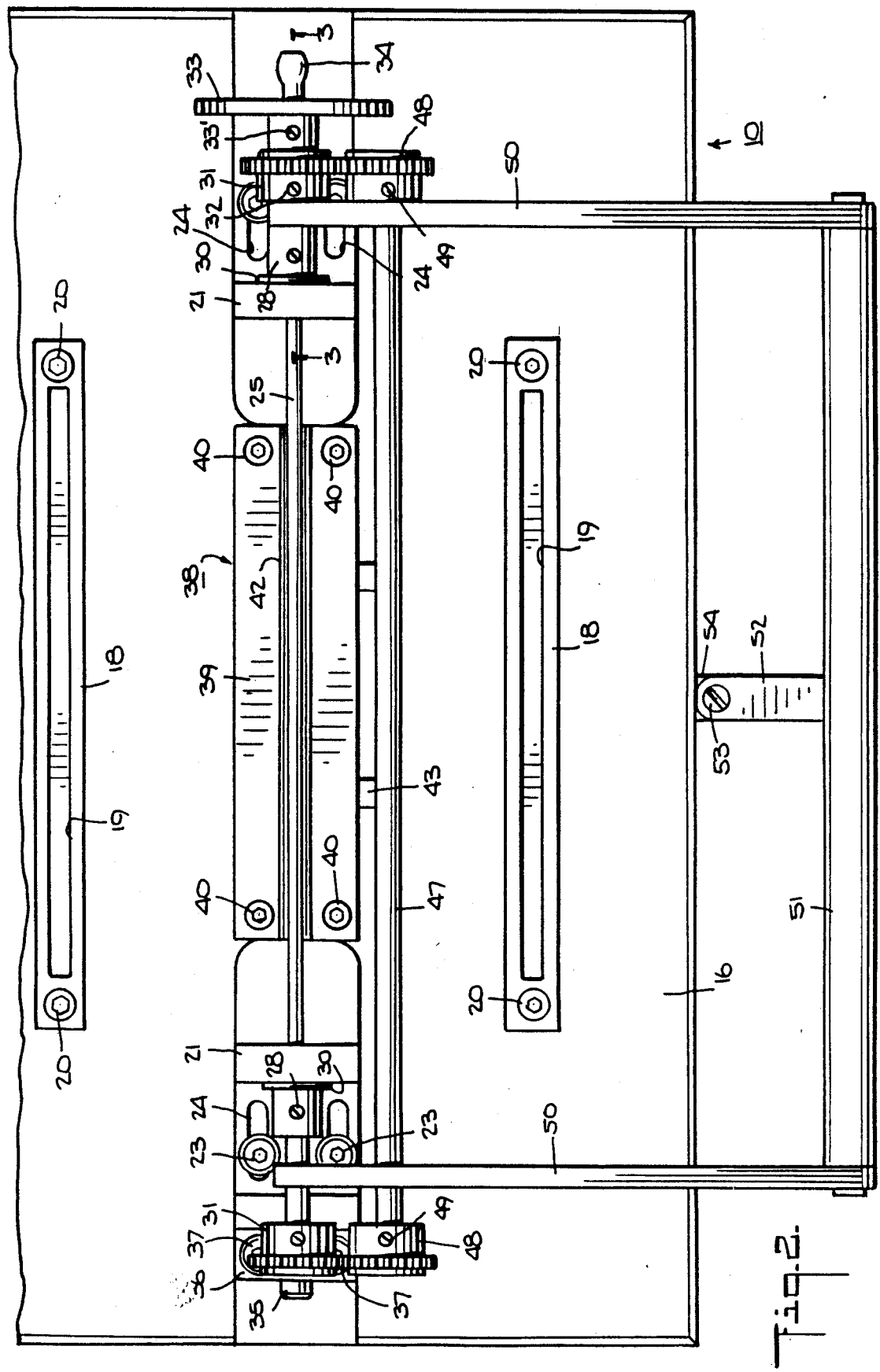
FIG. 2 illustrates a part plan view of a wafer alignment fixture constructed in accordance with the invention.
Figure 4:
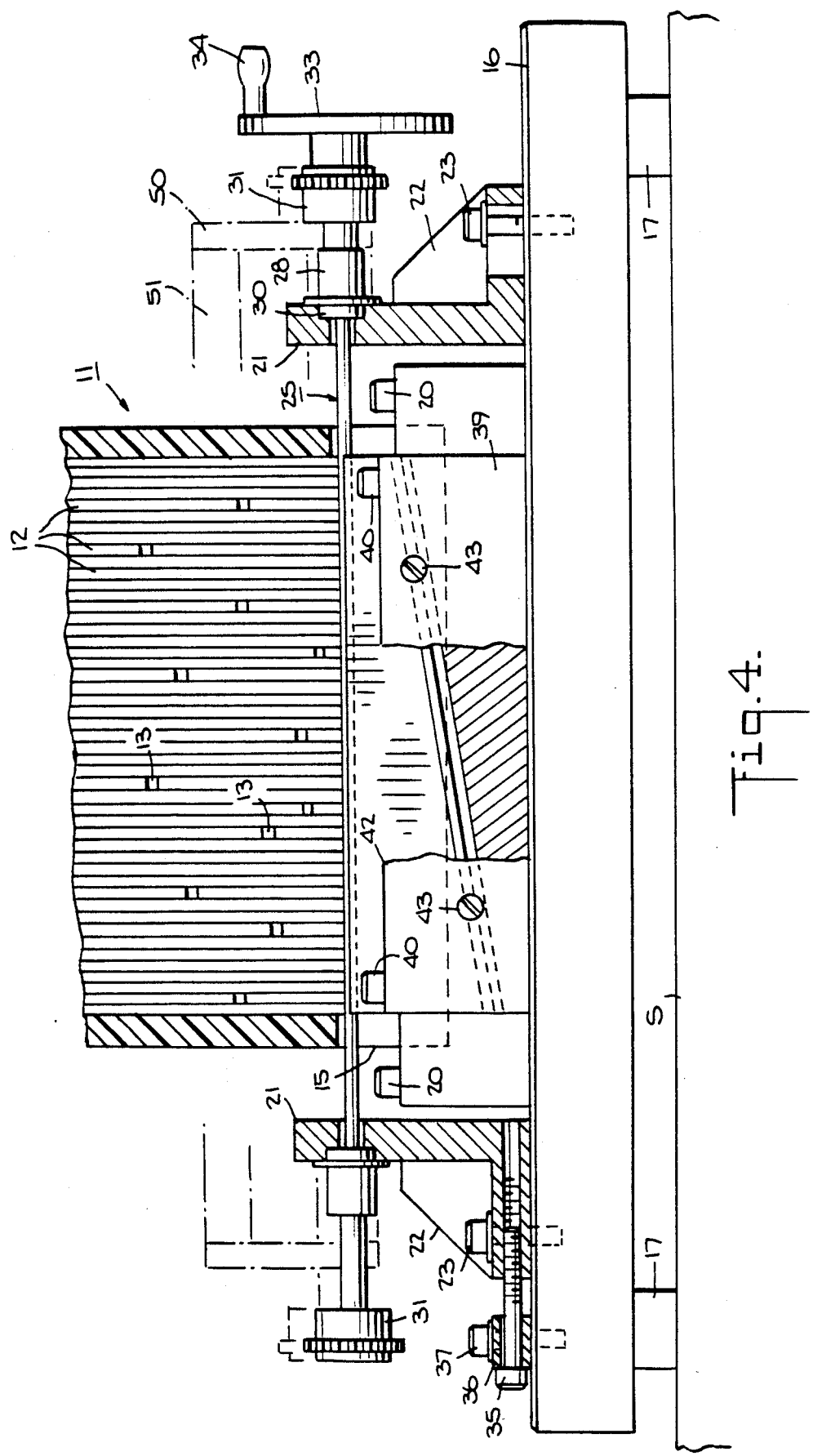
FIG. 4 illustrates a cross-sectional side view of the wafer alignment fixture with a cassette in place in accordance with the invention.

Referring to FIGS. 2 and 4, the wafer alignment fixture 10 is constructed so as to receive a cassette 11 containing a row of wafers 12 at least some of which are provided with notches 13 (FIG. 1). In this respect, the cassette 11 is of generally conventional structure and need not be described in detail. As indicated in FIG. 5, the cassette 11 has a pair of curvilinear side walls 14 which are sized so as to seat a wafer 12 thereon in upstanding manner. In this respect, the cassette 11 may be provided with ribs (not shown) to act as spacers between the wafers 12. In addition, the cassette has a pair of depending walls 15.

The wafer alignment fixture 10 includes a base plate 16, for example of rectangular shape, which has depending legs 17 secured thereon for mounting on a suitable support surface 5. In addition, the base plate 16 carries a cassette support means in the form of a pair of vertical upstanding walls 18 each of which is provided with an internal recess 19 at the upper end in order to receive a depending leg 15 of the cassette 11 (see FIG. 4). As indicated, each wall 18 is bolted to the base plate 16 by a pair of screws or bolts 20.

The wafer alignment fixture 10 also has a pair of brackets 21 mounted on the base plate 16. Each bracket 21 is of L-shaped cross-section and is provided with a transverse reinforcing web 22. Also, each bracket 21 is secured to the base plate 16 by a pair of bolts 23 disposed to opposite sides of the web 22. As illustrated in FIG. 2, each bracket 21 has an elongated slot 24 receiving a bolt 23 to permit longitudinal adjustment of the brackets 21 towards and away from each other on the base plate 16.

The brackets 21 serve as a means for rotatably mounting a roller 25 in parallel between the walls 18. As indicated in FIG. 6, the roller 25 is formed of a wire 26 and a frictional plastic tube or cover 27, for example, a cover 27 made of elastomeric material, such as polyurethane or other suitable plastic material. For example, the wire may be of 1/16 inch diameter while the plastic tube 27 has a wall thickness of 1/32 inch.

Figure 3:
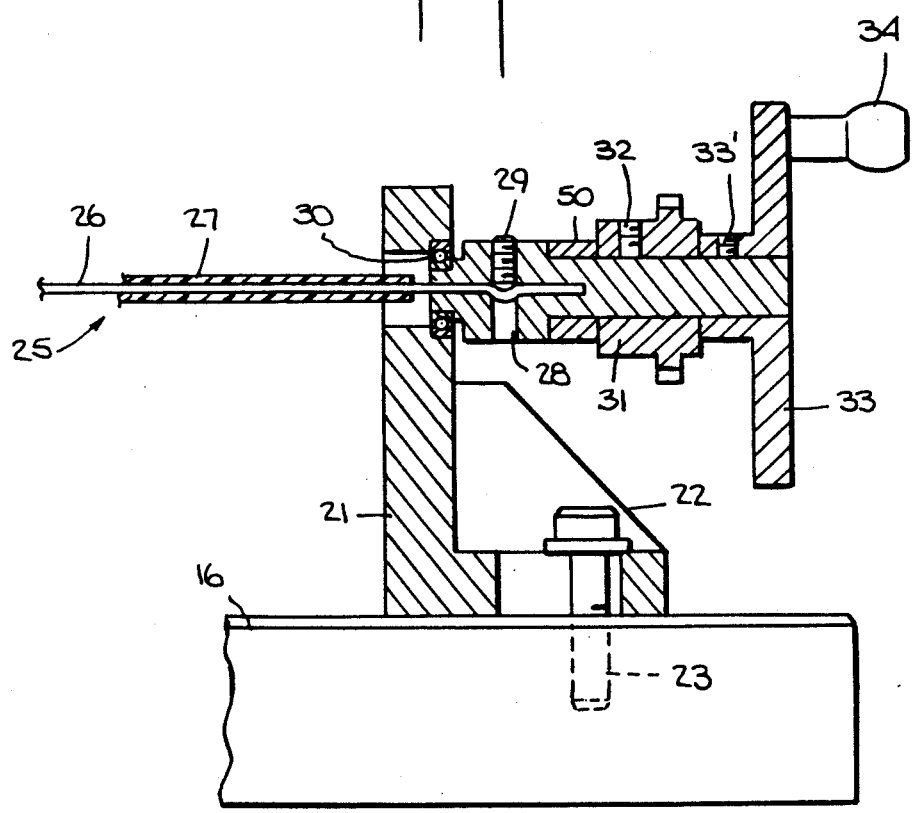
FIG. 3 illustrates a view taken on line 3—3 of FIG. 2.

Referring to FIG. 3, in order to rotatably mount the roller 25 in a respective bracket 21, each end of the wire 26 is exposed and inserted into a central bore of a stub shaft 28 and secured in place by a transversely disposed set screw 29. The stub shaft 28, in turn, supports a thrust bearing 30 at one end which, in turn, is journaled in a bracket 21. In addition, the stub shaft 28 carries a gear 31, also secured to the shaft 28 by means of a set screw 32 (see FIG. 2).

As indicated in FIG. 3, a means in the form of a manually operated wheel 33 is secured to the right-hand end of the roller 25 as by a screw 33' in order to cause rotation of the roller 25. As indicated, the wheel 33 carries a handle 34 which can be manually grasped in order to rotate the wheel 33 about the axis of the roller 25.

Referring to FIG. 4, a means for tensioning the wire 26 of the roller 25 is provided in order to eliminate sag due to the weight of the wafers 12 on the roller 25. This tensioning means includes an adjusting screw 35 which passes through a block 36 secured by a pair of bolts 37 to the base plate 16 adjacent the left-hand end bracket 21. In addition, the adjusting screw 35 threads into the left-hand bracket 21. Thus, upon turning to the screw 35, the left-hand bracket 21 may be moved longitudinally relative to the right-hand bracket 21. This movement is carried out while the bolts 23 securing the left-hand bracket 21 are loosened so as to permit a longitudinal adjustment and, thus, tensioning of the roller 25.

Referring to FIGS. 2 and 4, the alignment fixture 10 also includes a wafer support means 38 for supporting each wafer 12 after a notch has been aligned with the roller 25, for example, as indicated in FIG. 7.

Referring to FIGS. 1, 4 and 5, the wafer support means 38 is formed by a lower wedge block 39 which is secured as by bolts 40 to the base plate 16 in parallel between the walls 18 which serve to mount the cassette 11. In addition, the wedge block 39 has a longitudinal groove 41 which opens towards the upper end of the block 39 and which extends angularly to form a ramp support for an upper wedge block 42. As shown in FIG. 5, the upper wedge block 42 is slidably received within the lower wedge block 39. Thus, upon movement of the upper wedge block 42 along the lower wedge block 39, the vertical position of the upper wedge block 42 can be changed.

Referring to FIG. 5, a pair of locking screws 43 are threaded into a side wall of the lower wedge block 39 to abut against the upper wedge block 42 in order to releasably secure the blocks 39, 42 together.

Referring to FIG. 6, the upper wedge block 42 is provided with a pair of upstanding walls 44 which are radiused to define support surfaces 45 of curvilinear shape in order to receive a peripheral edge of a wafer 12 thereon (see FIG. 7). The walls 44 are parallel to the roller 25 and straddle the roller 25 while defining a recess 46 into which the roller 25 projects. As indicated, the roller 25 is disposed outwardly of the walls 44.

Referring to FIGS. 2 and 5, a second roller 47 is disposed in parallel to the first roller 25. This second roller 47 has a diameter, for example of 5/16 inches and is made of metal. As above, this roller may also be provided with a friction covering (not shown).

Referring to FIG. 2, the second roller 47 carries a gear 48 at each end. Each gear 48 is secured to the shaft 47 by means of a set screw 49 and is in meshing engagement with a gear 31 secured to the first roller 25. In this way, rotation of the first roller 25 by the wheel 33 causes a simultaneous rotation of the second roller 47.

In addition, the second roller 47 is rotatably mounted in a pair of arms 50 each of which is pivotally mounted on and about a stub shaft 28 and which are interconnected by a bar or handle 51. The handle 51 serves to move the roller 47 from a rest position spaced from a row of aligned wafers 12 within the cassette 11 (FIG. 5) and a raised position (not shown) frictionally engaging a row of aligned wafers 12 in order to rotate the wafers in unison into a predetermined position.

Referring to FIG. 2, the righ-hand arm 50 is on the stub shaft 28 between a shoulder of the shaft 28 and the gear 31 at the right-hand end of the roller 25 while the other pivot arm 50 is slidably mounted on an exposed portion of the stub shaft 28 at the left-hand end of the roller 25 so as to accommodate the movement of the left-hand bracket 21 during tensioning of the first roller 25.

As also indicated in FIG. 2, a handle holder 52 is secured by means of a screw 53 to a mounting bracket 54 secured to a side wall of the base plate 16. This holder 52 serves to hold the handle 51 in place for the rest position of the second roller 47.

In order to utilize the wafer alignment fixture 10, a cassette 11 containing a row of wafers 12 is mounted on the fixture 10 with the legs 15 of the cassette 11 fitting into the walls 18 of the fixture 10 (see FIG. 5). At this time, the notches 13 of the respective wafers 12 may be randomly positioned within the cassette 11.

Where the peripheral notch 13 of a wafer 12 is out of alignment with the aligning roller 25 (see FIG. 1), the wafer 12 is raised from the side walls 14 upon contacting the roller 25 (see FIG. 5) since the roller 25 is positioned to project into the plane of the wafers 12 supported in the cassette 11. Presumably, a multiplicity of the wafers 12 will be raised slightly within the cassette 11. Thereafter, the wheel 33 is rotated so as to rotate the aligning roller 25. This, in turn, causes each non-aligned wafer 12 to rotate due to the frictional contact between the wafer 12 and roller 25 so as to bring the notch 13 thereof into alignment with the roller 25. For example, as indicated in FIG. 1, when the aligning roller 25 is rotated in a clockwise manner, each non-aligned wafer 12 will rotate in a counter-clockwise manner. Rotation of each such wafer 12 ceases upon the notch 13 of the wafer 12 coming into alignment with the roller 25. At this time, as indicated in FIG. 7, the wafer 12 will "drop" down onto the support surfaces 45 of the wedge block 42 with the roller 25 being spaced from the notch 13. The spacing of the roller 25 from the wafer 12 at this time prevents damage to the edge of the aligned wafer 12 due to rubbing which might otherwise be caused by contacting the rotating roller 25. In this respect, note is made that particles from the wafers 12 may become embedded in the cover 27 of the roller 25 such that, if this resulting abrasive surface rubs against the edge of a wafer 12 chipping and scratching may well occur. The spacing of roller 25 from the wafer 12 also prevents wear on the roller 25 by continued rotation of the roller 25 relative to any remaining unaligned wafers. However, it is more important to protect the wafer 12 from being rubbed than to protect the roller 25 from wearing.

After all of the wafers 12 in a cassette 11 have been aligned with the notches 13 thereof along a single axial line, i.e. the aligning roller 25, the handle 51 may be lifted from the rest position of FIG. 5 so as to lift the notches 13 away from the aligning roller 25. Rotation of the wheel 33 at this time will permit the aligned row of wafers to be rotated in unison so as to bring the line of notches into a different position. For example, the notches may be moved to a different angular position of the cassette 11 for subsequent processing.

The wafer cassette 11 may then be lifted from the fixture 10 in order to convey the aligned wafers 12 to a subsequent processing station. A fresh wafer cassette loaded with a row of wafers may then be placed on the fixture 10 and the aligning roller 25 subsequently rotated so as to bring the wafers in the cassette into alignment as above.

In the event that the fresh cassette has different dimensions or the wafers have notches 13 of different depths from previously aligned wafers, the upper wedge block 42 of the wafer support means may be adjusted to accommodate a different vertical position relative to the wafers.

Once a wafer cassette has been placed on the fixture, a minimum of time and effort is required in order to bring about an alignment of the notches of the respective wafers in the cassette. Further, the movement of the wafers into alignment can be performed in a reliable manner since the wafers remain in the cassette and only a minimum of movement is required on the part of the wafers in order to bring about alignment.

The wafer alignment fixture may also accommodate wafers which have alignment flats as well as one or more alignment notches. In this respect, during operation, the roller 25 inherently differentiates and ignores the alignment flats and aligns strictly on the notches as desired. That is, the alignment flats simply ride across the aligning roller 25.

The invention thus provides a wafer alignment fixture which is able to bring about an alignment of a row of notched wafers within a cassette in a relative simple efficient manner.

Further, the invention provides a wafer alignment fixture of relatively simple and compact construction. As such, the fixture can be mounted within a relatively small space in order to align the wafers contained in a conventional cassette.

The invention further provides a wafer aligning fixture which is able to gently handle the wafers of a cassette in order to bring the wafers into alignment with each other.

The invention also provides a wafer aligning fixture which is able to accommodate wafers having both alignment flats and alignment notches.

What is claimed is:

1. A wafer alignment fixture for wafers comprising
    cassette support means for supporting a cassette containing a row of wafers, at least some of said wafers having a peripheral notch therein;
    a first roller extending in parallel to said support means and disposed below the cassette to frictionally contact the row of wafers and to lift the wafers within the cassette;
    means for rotating said roller to cause the wafers in frictional contact with said roller to rotate within the cassette to bring a notch of a respective wafer into alignment with said roller; and
    wafer support means for supporting each wafer having a notch receiving said roller therein.

2. A wafer alignment fixture as set forth in claim 1 wherein said cassette support means includes a pair of parallel walls for supporting a wafer cassette thereon with said roller extending in parallel between said walls.

3. A wafer alignment fixture as set forth in claim 1 wherein said means includes a shaft secured to one end of said roller and a manually operated wheel secured to said shaft.

4. A wafer alignment fixture as set forth in claim 1 wherein said wafer support means includes an elongated block having a pair of upstanding support surfaces for receiving wafers thereon, and means for adjusting the height of said block.

5. A wafer alignment fixture as set forth in claim 4 wherein said block is of wedge shape and said means for adjusting the height of said block includes a second block of wedge shape slidably receiving said elongated block therein and locking screws for securing said blocks together.

6. A wafer alignment fixture as set forth in claim 1 which further comprises a second roller parallel to said first roller, a handle rotatably mounting said second roller therein and being pivotally mounted on said first roller and gear means interconnecting said rollers to each other.

7. A fixture as set forth in claim 1 wherein said first roller has an elastomeric peripheral surface.

8. A fixture as set forth in claim 7 wherein said roller includes a longitudinally extending wire and means for tensioning said wire to eliminate sag due to the weight of the wafers.

9. A wafer alignment fixture for wafers having a notch in a periphery thereof comprising
    a pair of parallel spaced apart support surfaces for supporting a cassette containing a row of wafers therein;
    a roller rotatably mounted in parallel between said support surfaces to project into the plane of each wafer supported in a cassette on said support surfaces; and
    means for rotating said roller to rotate the wafers thereon into alignment of the notch of each wafer with said roller.

10. A fixture as set forth in claim 9 wherein said roller has an elastomeric peripheral surface.

11. A fixture as set forth in claim 9 wherein said roller includes an elastomeric tube and a wire extending longitudinally through said tube and means for tensioning said wire to eliminate sag due to the weight of the wafers thereon.

12. A fixture as set forth in claim 9 which further comprises a pair of brackets mounting said roller therebetween.

13. A fixture as set forth in claim 12 wherein said means is a manually operated wheel drivingly connected to said roller.

14. A fixture as set forth in claim 12 wherein said roller has a diameter of 0.125 inches.

15. A fixture as set forth in claim 12 wherein one of said brackets is movable relative to the other of said brackets walls to tension said roller therebetween.

16. In combination,
    a wafer cassette having a pair of side walls defining a space to receive a row of wafers in perpendicular relation therebetween; and
    a wafer alignment fixture removably receiving said cassette thereon, said fixture including a pair of support surfaces disposed for supporting a row of wafers thereon, a roller rotatably mounted in parallel between said support surfaces and projecting radially outwardly of said support surfaces relative to the row of wafers to raise the wafers from said support surfaces; and
    means for rotating said roller to rotate the wafers thereon to align the notch of each wafer with said roller wherein each wafer becomes supported on said support surfaces with the notch thereof receiving said roller.

17. The combination as set forth in claim 16 wherein said roller has an elastomeric peripheral surface.

18. The fixture as set forth in claim 16 wherein said roller includes a plastic tube and a wire extending longitudinally through said tube and which further includes means for tensioning said wire to eliminate sag due to the weight of the wafers.

19. The combination as set forth in claim 16 wherein said fixture includes a pair of brackets having said roller rotatably mounted therein.

20. The combination as set forth in claim 19 wherein one of said brackets is movable longitudinally relative to the other of said brackets.

21. A wafer alignment fixture comprising
a first elongated roller disposed on a fixed longitudinal axis for receiving a row of upstanding wafers thereon, at least some of the wafers having a notch in a periphery thereof;
means for rotating said roller about said axis to cause the wafers resting thereon to rotate; and
support means normally spaced from the row of wafers for supporting the wafers thereon when the notch of each wafer is in alignment with and receives said roller therein.

22. A wafer alignment fixture as set forth in claim 21 wherein said support means is an elongated block having a pair of upstanding walls defining support surfaces for receiving the wafers thereon, said roller being disposed between said walls.

23. A wafer alignment fixture as set forth in claim 22 wherein said block is vertically adjustable.

24. A wafer alignment fixture as set forth in claim 21 which further comprises means for tensioning said roller to eliminate sag due to the weight of the wafers thereon.

25. A wafer alignment fixture as set forth in claim 24 which further comprises a pair of brackets rotatably mounting said roller therein and wherein said means for tensioning includes an adjusting screw for moving one of said brackets longitudinally relative to the other of said brackets.

26. A wafer alignment fixture as set forth in claim 21 which further comprises a second roller parallel to said first roller, gear means interconnecting said second rollers to said first roller for rotation therewith and a handle for moving said second roller between a rest position spaced from a row of aligned wafers and a raised position frictionally engaging a row of aligned wafers to rotate the wafers in unison into a predetermined position.

* * * * *

UNITED STATES PATENT AND TRADEMARK OFFICE
CERTIFICATE OF CORRECTION

PATENT NO. : 4,970,772
DATED : Nov. 20, 1990
INVENTOR(S) : ROBERT E. STEERE, III

It is certified that error appears in the above-identified patent and that said Letters Patent is hereby corrected as shown below:

```
Title Page change "ASSIGNEE:  SULZER BROTHERS ... Switzerland" to
      --Assignee:  Silicon Technology Corporation
                   Oakland, New Jersey--
In the Abstract, line 7 change "rollers." to -roller-
Column 4, line 4 change "righ-hand" to -right-hand-
```

Signed and Sealed this

Fourteenth Day of July, 1992

Attest:

DOUGLAS B. COMER

*Attesting Officer*   Acting Commissioner of Patents and Trademarks